United States Patent
Nakamura et al.

[19]

[11] Patent Number: 5,868,836
[45] Date of Patent: Feb. 9, 1999

[54] SEMICONDUCTOR SINGLE-CRYSTAL LIFT DEVICE

[75] Inventors: Shigeki Nakamura; Koichi Shimomura; Teruhiko Uchiyama, all of Omura, Japan

[73] Assignee: Komatsu Electronic Metal Co., Ltd., Hiratsuka, Japan

[21] Appl. No.: 786,766

[22] Filed: Jan. 21, 1997

[30] Foreign Application Priority Data

Jan. 19, 1996 [JP] Japan ................................. 8-038627

[51] Int. Cl.⁶ .................................................. C30B 35/00
[52] U.S. Cl. ......................... 117/208; 117/200; 117/217; 117/222; 117/900
[58] Field of Search .................................. 117/200, 208, 117/213, 217, 222, 900, 211

[56] References Cited

U.S. PATENT DOCUMENTS 5,363,796  11/1994  Kobayashi et al. .................... 117/30
5,441,014  8/1995  Tomioka et al. ...................... 117/213

FOREIGN PATENT DOCUMENTS 2267195  10/1990  Japan .
5344980  12/1993  Japan .
7172971  11/1995  Japan .

*Primary Examiner*—Felisa Garrett
*Attorney, Agent, or Firm*—Varndell Legal Group

[57] ABSTRACT

A semiconductor single crystal lift device which comprises a crucible for melting materials for forming semiconductor single crystals and a radiation screen disposed at an upper portion of the crucible and formed of a reversed-cone-shaped adiabatic tube surrounding a lift zone, the apparatus being adopted for lifting up the semiconductor single crystal from a melt in the crucible, in which the radiation screen is divided into more than three adiabatic members, at least part of the adiabatic members being configured in a detachable fashion so that an adiabatic nature of the radiation screen can be partly altered.

9 Claims, 7 Drawing Sheets

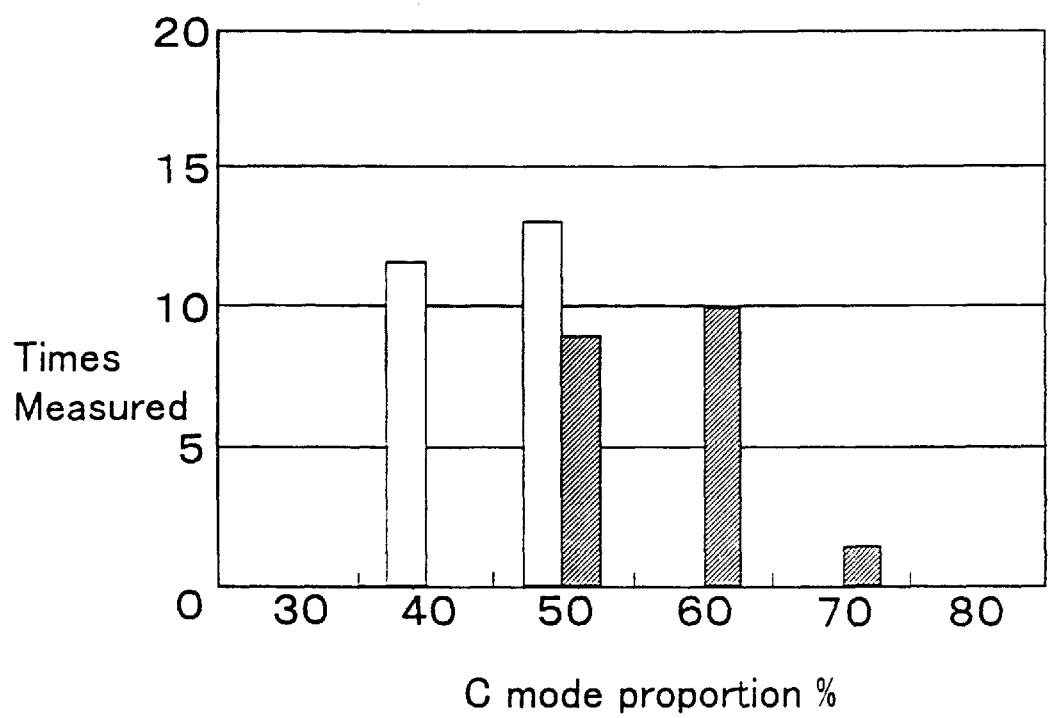
Fig.5
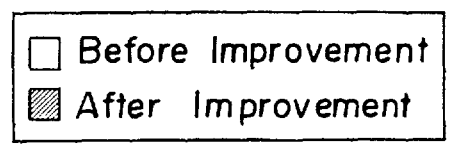

SEMICONDUCTOR SINGLE-CRYSTAL LIFT DEVICE

BACKGROUND OF THE INVENTION

1. Field of the Invention

The present invention relates to a semiconductor single-crystal lift device for producing semiconductor single crystals by using the Czochralski Method (the CZ method).

2. Description of the Related Art

As disclosed in Japanese Patent Application Laid-open No. 7-172971, a radiation shield screen is used in the process of lifting crystals for the purpose of accelerating the lift speed, avoiding pollution of impurities and improving the yield of dislocation-free crystals. The radiation shield screen is constructed from an upper screen and a lower screen. The upper screen consists of a three-layer structure, which has two outer graphite members and an inner adiabatic material made of graphite or ceramic fibers disposed therebetween. The lower screen comprises a one-layer structure and is made of graphite, quartz or fine ceramics.

In a semiconductor single-crystal lift device provided with above-described radiation shield screen, the radiation shield screen is used to shield single crystals from the radiation coming from the melt and crucible made of quartz, and to expedite the cooling of single crystals. In other words, the radiation shield screen is used for heat obstruction. By way of omitting the adiabatic member disposed near the free surface of the melt, the high temperature zone (above the free surface of the melt) of over 1200° C. can be expanded so as to prolong the time required for passing grown crystals through the high temperature zone. To obtain high dielectric strength of oxidation layers formed on semiconductor wafers, it is necessary to prolong to the maximum the time single crystals pass through the high temperature region (at 1000° C. to 1200° C. ). The above requirement is nowadays well-known to those skilled in this art.

However, in the above mentioned prior art process, at temperatures ranging from 1000° C. to 1200° C., single crystals cool quickly, which causes a decline in dielectric strength of oxidation layers formed on single crystals. On the other hand, if the lifting speed is reduced, dielectric strength of oxidation layers formed on single crystals is enhanced, yet the yield of single crystals decreases. In conclusion, to enhance dielectric strength of oxidation layers formed on single crystals, it is essential to reduce the cooling speed of single crystals at temperatures ranging from 1000° C. to 1200° C. Furthermore, to reduce the amount of OSF(Oxygen Stacking Fault) and oxygen precipitation, it is required to accelerate the cooling speed of single crystals at temperatures below 1000° C.

SUMMARY OF THE INVENTION

The object of the present invention is to provide a semiconductor single-crystal lift device which utilizes the Czochralski Method to efficiently produce semiconductor single crystals, such as silicon single crystals, oxidation layers formed on which have high dielectric strength.

To achieve the above object, according to this invention, A semiconductor single crystal lift device comprises a crucible for melting material for forming a semiconductor single crystal and a radiation screen disposed at an upper portion of the crucible and formed of a reversed-cone-shaped adiabatic tube surrounding a lift zone, the apparatus being adopted for lifting up the semiconductor single crystal from a melt in the crucible, in which the radiation screen is divided into more than three adiabatic members, at least part of the adiabatic members being configured in a detachable fashion so that an adiabatic nature of the radiation screen can be partly altered.

Preferably, the adiabatic members are fabricated from at least two kinds of different adiabatic materials.

Preferably, the radiation screen may comprises an upper end portion, a middle portion and a lower end portion and, the middle portion may be configured to have an inferior adiabatic nature compared to that of the upper end portion and the lower end portion.

Preferably, a temperature at the upper end portion is less than 1000° C., a temperature at the middle portion ranges from 1000° C. to 1200° C., and a temperature at the lower end portion is greater than 1200° C.

Preferably, the middle portion may have a laminated structure of an adiabatic material and a non-adiabatic material.

Preferably, the middle portion may be configured with an adiabatic material provided with holes.

Preferably, the middle portion may be configured with an adiabatic material provided with slit apertures.

Preferably, the middle portion may comprise a middle adiabatic material having a thickness greater than that of the upper end portion.

Preferably, the inside of the radiation screen may be covered in a detachable fashion with a reverse-cone-shaped adiabatic material.

In the semiconductor single-crystal lift device according to this invention, the temperature distribution in the direction of lift axis within the region surrounded by the radiation screen can be easily adjusted by removing some of the adiabatic portions of the radiation screen divided more than 3 portions. The adiabatic nature of the radiation screen will decrease to some extent by removing some of the adiabatic portions. For example, by removing the middle piece of the radiation screen, the region at a temperature between 1000° C. and 1200° C. will become twice as large as it was, and the time required to pass therethrough can thus be extended. In addition, the temperature gradient at the boundary between liquid and solid states can accordingly able to be enlarged, and the lifting speed is also be increased.

This invention has been disclosed as above, to put it briefly, for improving the yield of dislocation-free crystals, the radiation screen is divided into at least three adiabatic portions, and by allowing some of the adiabatic portions to be connected together in a detachable manner so that the adiabatic ability of the radiation screen can be partly altered. By such an arrangement, in a semiconductor single crystal lift device using the Czochralski Method (for such as silicon single crystals), any heat treatment procedures can be applied to any single crystal to be produced, and various quality specifications for single crystals can be obtained. In particular, due to the fact that the adiabatic nature at the locations near the middle portion is inferior to that of the upper and lower portions, the amount of OSF and oxygen precipitation of the single crystal produced can be reduced, and it is thus possible to efficiently produce semiconductor single crystals on which oxidation layers are formed have high dielectric strength.

BRIEF DESCRIPTION OF THE DRAWINGS

The present invention can be more fully understood by reading the subsequent detailed description and examples with references made to the accompanying drawings, wherein:

FIG. 5 is a diagram showing the dielectric strength of oxide layers measured from 6" P-type single crystals with their crystal axes in the <100> direction, which are produced by lift devices installed with radiation screens according to the present invention, in which the horizontal axis denotes the percentages of C mode proportion within measured crystals and the vertical axis denotes times measured;

DETAILED DESCRIPTION OF THE PREFERRED EMBODIMENTS

Figure 1:
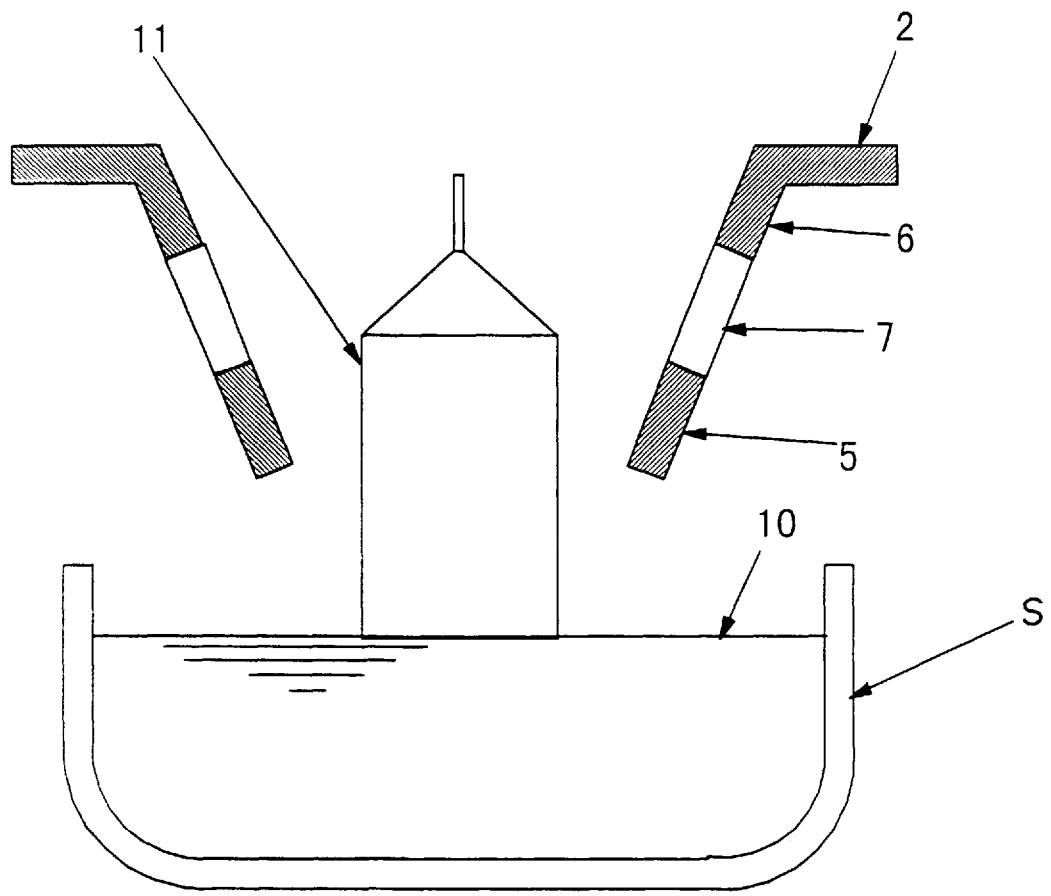
FIG. 1 is a sectional diagram showing a first embodiment of the radiation screen according to the present invention.
Figure 2:
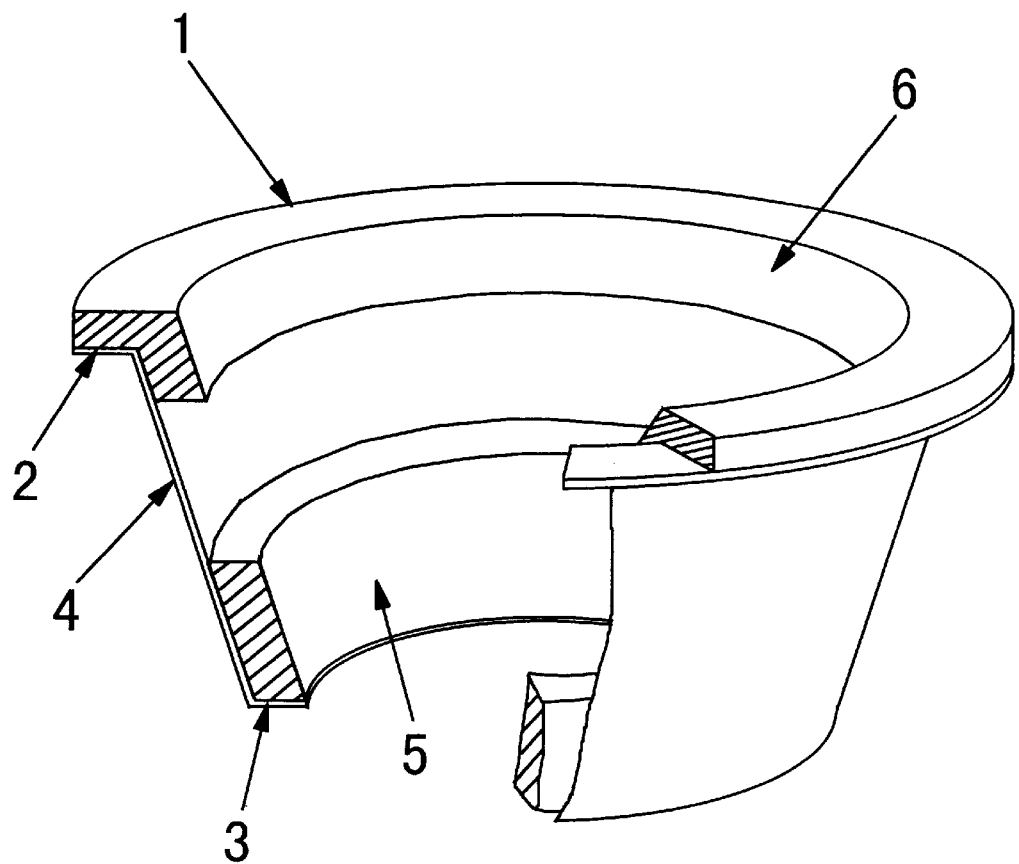
FIG. 2 is a perspective view showing the same as shown in FIG. 1, with a portion removed therefrom.

According to the present invention, in a semiconductor single crystal lift device which utilizes the Czochralski Method (CZ method) to produce semiconductor single crystals such as silicon single crystals, the numeral 1 in the figures denotes a radiation screen shaped like a reversed frustrated cone the upper opening of which is larger than its lower one. The radiation screen 1 is made of adiabatic material and is disposed above a crucible S made of quartz in such a way that the radiation screen surrounds the lift zone through which single crystals are lifted from the crucible S in which melting crystal material is deposited. As shown in FIGS. 1 and 2, the radiation screen 1 consists of an outer graphite member 4, a ring-shaped lower adiabatic member 5, and an upper adiabatic member 6. The outer graphite member 4 is shaped like a reversed frustrated cone with its upper end portion being formed into a ring-shaped flange 2 and its lower end portion being formed into an engaging rim 3. The lower adiabatic member 5 is made of, for example, ceramic fibers and is detachably engaged on the engaging rim 3 along the inner wall of the outer graphite member 4. The upper adiabatic member 6 made of ceramic fibers is shaped like a ring with a flange and is detachably engaged on the flange 2 along the inner wall of the outer graphite member 4. The lower adiabatic member 5 and the upper adiabatic member 6 are disposed apart and face each other, and only the outer graphite member 4 is left therebetween. By such an arrangement, the radiation screen 1 is divided into three adiabatic portions, that is, an upper adiabatic portion (a two-layer structure formed by the outer graphite member 4 and the upper adiabatic member 6) at temperatures below 1000° C., a middle adiabatic portion (a one-layer structure formed by the graphite member 4 only) at temperatures between 1000° C. and 1200° C., and a lower adiabatic portion (a two-layer structure formed by the outer graphite member 4 and the lower adiabatic member 5) at temperatures above 1200° C. By allowing some of the adiabatic members to be able to disengaged from the outer graphite member 4, the adiabatic nature of the radiation screen 1 can be partly changed. Furthermore, it may be best if the lower adiabatic member 5 and the upper adiabatic member 6 are fabricated from different adiabatic materials.

Figure 3:
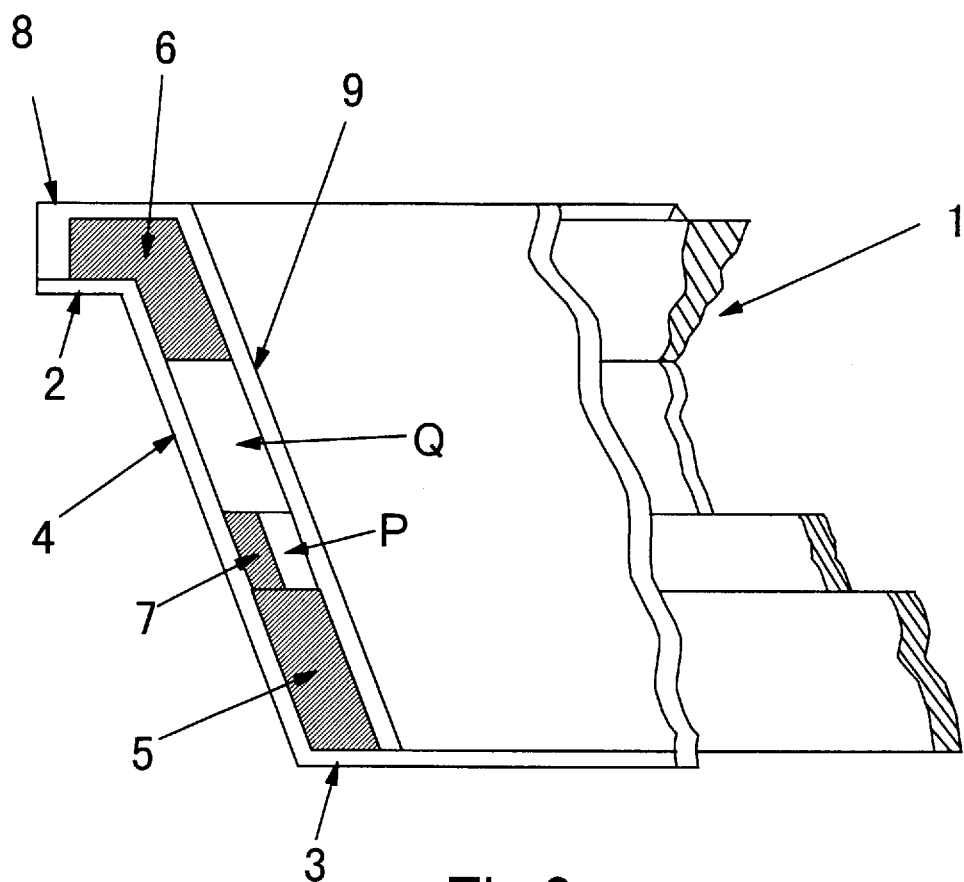
FIG. 3 is a sectional diagram showing a second embodiment of the radiation screen according to the present invention.

As shown in FIG. 3 as a second embodiment of the present invention, it is an alternative to dispose a ring-shaped middle adiabatic member 7, made of ceramic fibers and of less thickness, between the lower adiabatic member 5 and the upper adiabatic member 6 in such a manner that the middle adiabatic member 7 is spaced apart from the upper adiabatic member 6, and only the graphite member 4 is left therebetween. An inner graphite member 9 having a shape of reversed frustrated cone may be disposed within the inner graphite member 4. The graphite member 9 is provided with a ring-shaped engaging flange 8 for the purpose of engaging with the upper adiabatic member 6 in a detachable way. With such an arrangement, the upper portion of the radiation screen 1 at a temperature below 1000° C. consists of a three-layer structure, that outer is, the graphite member 4, the upper adiabatic member 6, and the graphite member 9. The middle portion at temperatures ranging from 1000° C. to 1200° C. is composed of a two-layer section (the outer graphite member 4 and the inner graphite member 9, with a space Q sandwiched therebetween), and a three-layer section (the outer graphite member 4, the ring-shaped middle adiabatic member 7, and the inner graphite member 9, with a space P sandwiched between the ring-shaped middle adiabatic member 7 and the inner graphite member 9). The lower portion at a temperature above 1200° C. consists of a three-layer structure, that is, the outer graphite member 4, the lower adiabatic member 5, and the inner graphite member 9. Thus, the whole radiation screen 1 is divided into four adiabatic zones. In the FIGS. 1 and 2, 10 denotes melt and 11 denotes a single crystal being lifted.

Figure 4:
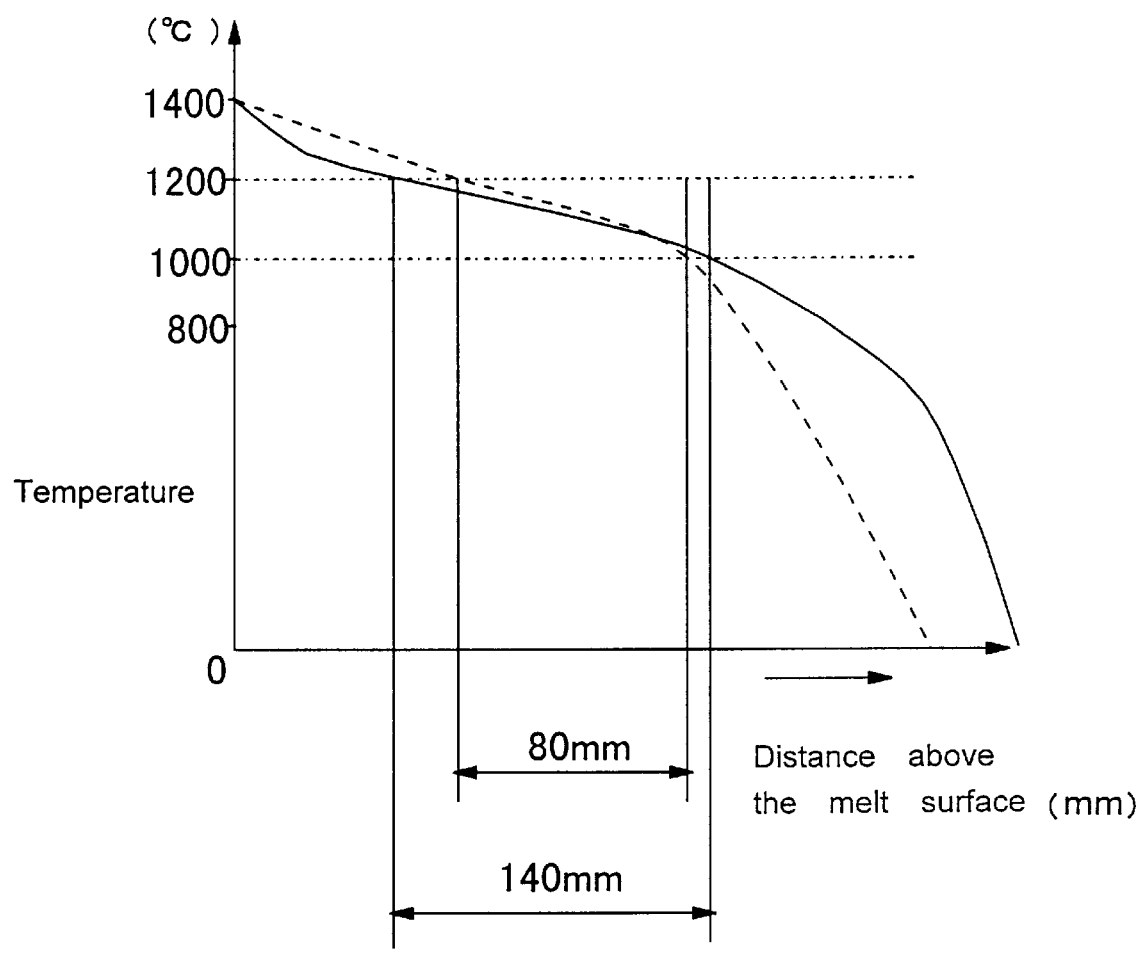
FIG. 4 is a graph showing the cooling curve during lifting of single crystals, in which the horizontal axis denotes distance (mm) above the free surface of the melt and the vertical axis denotes the temperature (°C.) measured from a single crystal being lifted.

Since the adiabatic nature of the middle portion of the radiation screen 1 is minor, radiation heat coming from the melt or the crucible S made of quartz can not be shielded completely. The radiation heat coming from melt 10 will directly reach the middle portion of the single crystal 11 being lifted or will be reflected by the inner surface of the crucible made of quartz S and subsequently pass through the single crystal 11. Thus, the temperature of the middle portion of the single crystal 11 is increased to a value ranging from 1000° C. to 1200° C. In FIG. 4, a solid line A notes the cooling curve during lifting of single crystals proceeded in a semiconductor single crystal lift device equipped with the radiation screen 1, wherein the horizontal axis denotes the distance (mm) above the free surface of the melt and the vertical axis denotes the temperature (°C.) measured from the single crystal being lifted. A dotted line B is also shown thereon for comparison, which denotes the cooling curve taken from a conventional semiconductor single-crystal lift device. In this case, the temperature gradient at the boundary between solid state and liquid state in the device according to this invention became about twice that of conventional ones, and in the region with a temperature between 1000° C. and 1200° C., the temperature gradient was about 1.8 times that of conventional devices. As a result, the lifting speed in this invention can be raised to a value about 1.2 times that of conventional ones. Furthermore, the time period for passing through the region with a temperature between 1000° C. and 1200° C. was extended to a value about 1.5 times that in conventional devices. Besides, the dielectric strength of oxidation-layer formed thereon was improved. As shown in FIG. 5, the dielectric strength of oxidation-layer was measured from 6" P-type single crystals with their crystal axes in the <100> direction, which are produced by lift devices installed with radiation screens according to the present invention, the results showed that C mode proportion (with high dielectric strength of oxidation-layer) increased by 15%, wherein the horizontal axis denotes C mode proportion within measured crystals and the vertical axis denotes times measured. In addition, due to the fact that the inner graphite member 9 shaped like a reversed frustrated cone covers the ring-shaped adiabatic members 5, 6, and 7 of the radiation screen 1 in a detachable way, the wearing away of adiabatic members 5, 6, and 7 can be prevented and the cooling curve slop is much sharper.

Figure 6:
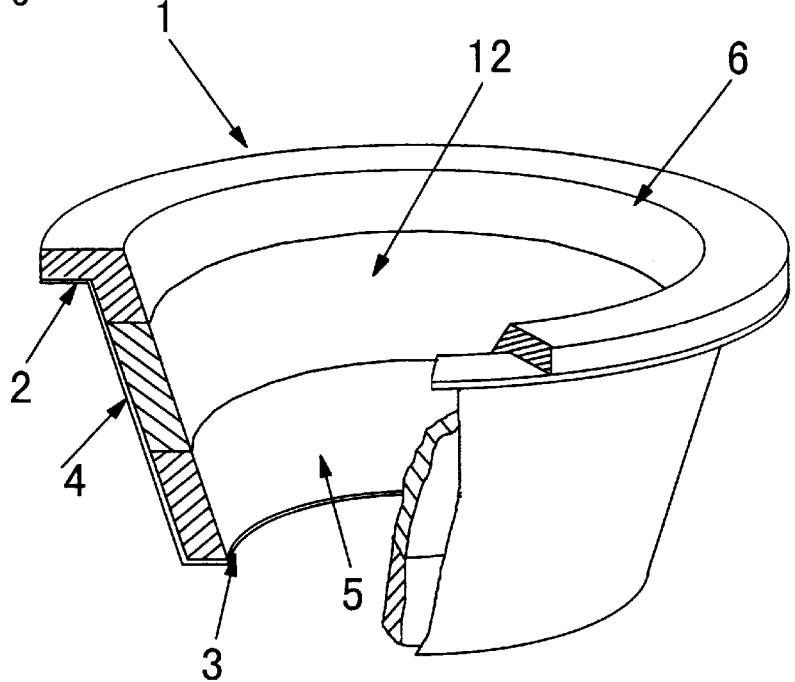
FIG. 6 is a perspective view showing a radiation screen with a part thereof being sectioned, according to a third embodiment of the present invention.

Moreover, in the embodiment shown in FIG. 2, the radiation screen 1 is divided into three adiabatic portions, that is, the upper adiabatic portion (a two-layer structure formed by the outer graphite member 4 and the upper adiabatic member 6) at temperatures below 1000° C., the middle adiabatic portion (a one-layer structure formed by the outer graphite member 4 only) at temperatures ranging from 1000° C. to 1200° C., and the lower adiabatic portion (a two-layer structure formed by the outer graphite member 4 and the lower adiabatic member 5) at temperatures above 1200° C. However, it is obvious that the parts or the numeric data disclosed above are not intended to limit any measures capable of reducing the adiabatic ability of the middle adiabatic portion of the radiation screen 1. For example, it is also effective to structure the middle portion of the radiation screen 1 without the adiabatic function. That is, as shown in FIG. 6 as a third embodiment of the present invention, the middle portion may be a two-layer structure with a non-adiabatic member 12 intervened.

Figure 7:
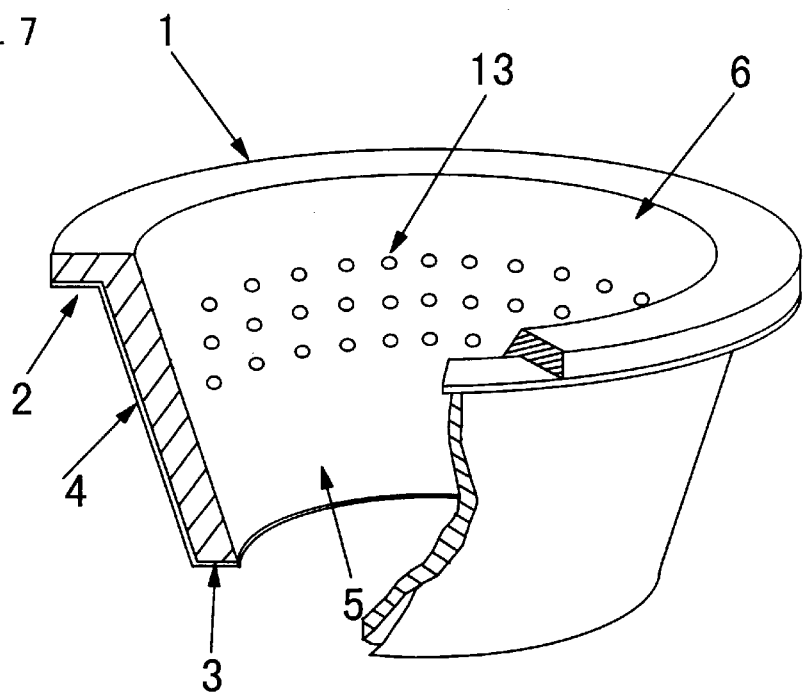
FIG. 7 is a perspective view showing a radiation screen with a part thereof being sectioned, according to a fourth embodiment of the present invention.

Further, as shown in FIG. 7 as a fourth embodiment of the present invention, the radiation screen 1 may be the single-layer structure with the adiabatic material, and the middle portion, which is integrally formed by the upper end portion and the lower end portion, may be provided with holes 13.

Figure 8:
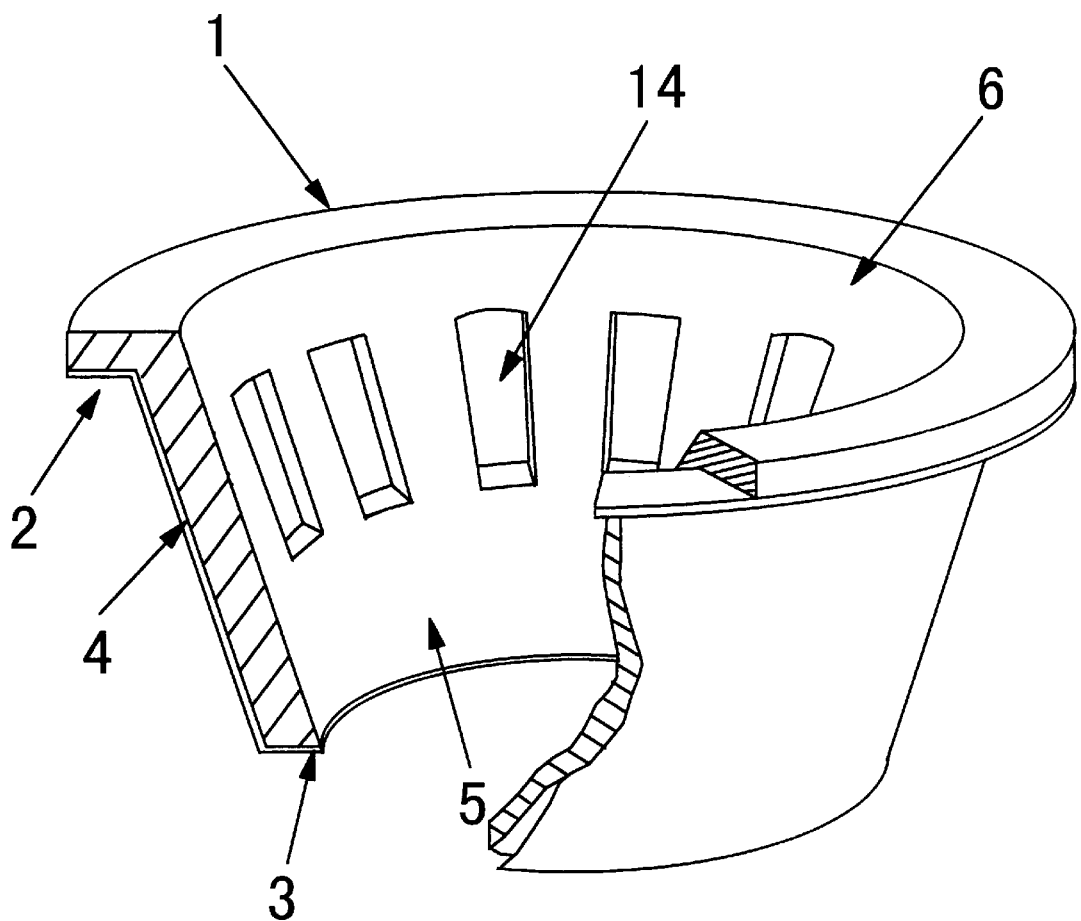
FIG. 8 is a perspective view showing a radiation screen with a part thereof being sectioned, according to a fifth embodiment of the present invention.

Alternatively, as shown in FIG. 8 as a fifth embodiment of the present invention, the radiation screen 1 may be the single-layer structure formed by the adiabatic material, and the middle portion, which is integrally formed by the upper end portion and the lower end portion, may be provided with slit apertures 14.

What is claimed is:

1. A semiconductor single crystal lift device comprising a crucible for melting a material for forming a semiconductor single crystal and a radiation screen disclosed at an upper portion of the crucible and formed of a reversed-cone-shaped adiabatic tube surrounding a lift zone, the apparatus being adapted for lifting up the semiconductor single crystal from a melt in the crucible, wherein the radiation screen is divided into adiabatic members including an upper end portion, a middle portion and a lower end portion, at least part of the portions of the radiation screen being detachable configured so that an adiabatic nature of the radiation screen can be partly altered.

2. A semiconductor single crystal lift device as claimed in claim 1, wherein the adiabatic members are fabricated from at least two kinds of different adiabatic materials.

3. A semiconductor single crystal lift device as claimed in claim 1, wherein the middle portion is configured to have an inferior adiabatic nature compared to that of the upper end portion and the lower end portion.

4. A semiconductor single crystal lift device as claimed in claim 3, wherein a temperature at the upper end portion is less than 1000° C., a temperature at the middle portion ranges from 1000° C. to 1200° C. and a temperature at the lower end portion is greater than 1200° C.

5. A semiconductor single crystal lift device as claimed in claim 3, wherein the middle portion has a laminated structure of an adiabatic material and a non-adiabatic material.

6. A semiconductor single crystal lift device as claimed in claim 3, wherein the middle portion is configured with an adiabatic material having holes.

7. A semiconductor single crystal lift device as claimed in claim 3, wherein the middle portion is configured with an adiabatic material having slit apertures.

8. A semiconductor single crystal lift device as claimed in claim 3, wherein the middle portion comprises a middle adiabatic material having a thickness less than that of the upper end portion.

9. A semiconductor single crystal lift device as claimed in claim 1, wherein an inside of the radiation screen is covered in a detachable fashion with a reverse-cone-shaped adiabatic material.

\* \* \* \* \*